(12) United States Patent
Covington

(10) Patent No.: US 7,825,445 B2
(45) Date of Patent: Nov. 2, 2010

(54) MAGNETORESISTIVE MEMORY ELEMENTS WITH SEPARATE READ AND WRITE CURRENT PATHS

(75) Inventor: Mark William Covington, Greenburg, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 160 days.

(21) Appl. No.: 11/947,194

(22) Filed: Nov. 29, 2007

(65) Prior Publication Data
US 2009/0141541 A1 Jun. 4, 2009

(51) Int. Cl.
H01L 29/76 (2006.01)
(52) U.S. Cl. .......................... 257/295; 257/2; 257/252; 257/421; 257/695; 257/E21.436; 257/E21.663
(58) Field of Classification Search ................ 257/295, 257/2, 252, 421, 695
See application file for complete search history.

(56) References Cited

U.S. PATENT DOCUMENTS

| | | | |
|---|---|---|---|
| 7,031,178 B2 | 4/2006 | Parkin | 365/80 |
| 7,187,577 B1 | 3/2007 | Wang et al. | 365/158 |
| 7,190,611 B2 | 3/2007 | Nguyen et al. | 365/158 |
| 7,221,584 B2 | 5/2007 | Liu et al. | 365/158 |
| 7,576,956 B2 * | 8/2009 | Huai | 360/324.2 |
| 2006/0152973 A1 | 7/2006 | Lin et al. | 365/173 |
| 2006/0175675 A1 | 8/2006 | Braun | 257/421 |
| 2006/0176734 A1 | 8/2006 | Braun | 365/171 |
| 2007/0035891 A1 | 2/2007 | Freitag et al. | 360/324.11 |
| 2007/0097560 A1 | 5/2007 | Karr et al. | 360/324.2 |
| 2007/0097730 A1 | 5/2007 | Chen et al. | 365/158 |
| 2007/0164380 A1 | 7/2007 | Min et al. | 257/421 |
| 2007/0165449 A1 | 7/2007 | Zheng et al. | 365/158 |
| 2007/0171694 A1 | 7/2007 | Huai et al. | 365/145 |
| 2007/0183186 A1 | 8/2007 | Peng et al. | 365/158 |
| 2007/0195594 A1 | 8/2007 | Koga | 365/171 |
| 2007/0242505 A1 * | 10/2007 | Ochiai et al. | 365/171 |

* cited by examiner

*Primary Examiner*—Long Pham
(74) *Attorney, Agent, or Firm*—Campbell Nelson Whipps LLC

(57) ABSTRACT

A magnetoresistive memory element has a free layer, and a write current path aligned with a free layer plane. The memory element has a pinned layer with a magnetization direction aligned with that of the free layer. A barrier layer is disposed between the free layer and the pinned layer. The free, barrier and pinned layers together form a layer stack that has a read current path that extends through the layer stack and that is not aligned with the write current path in the free layer.

16 Claims, 17 Drawing Sheets

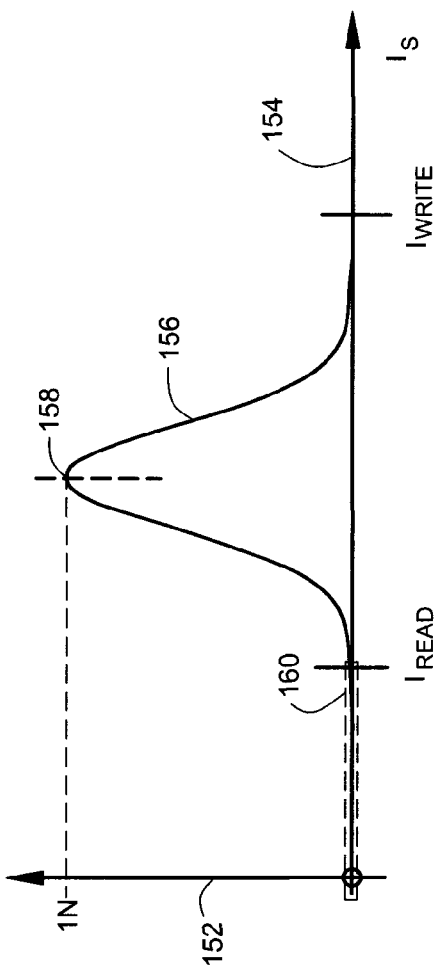
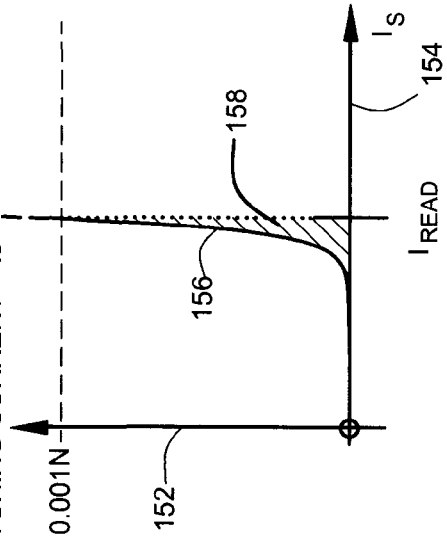
FIG. 1B
FIG. 1C

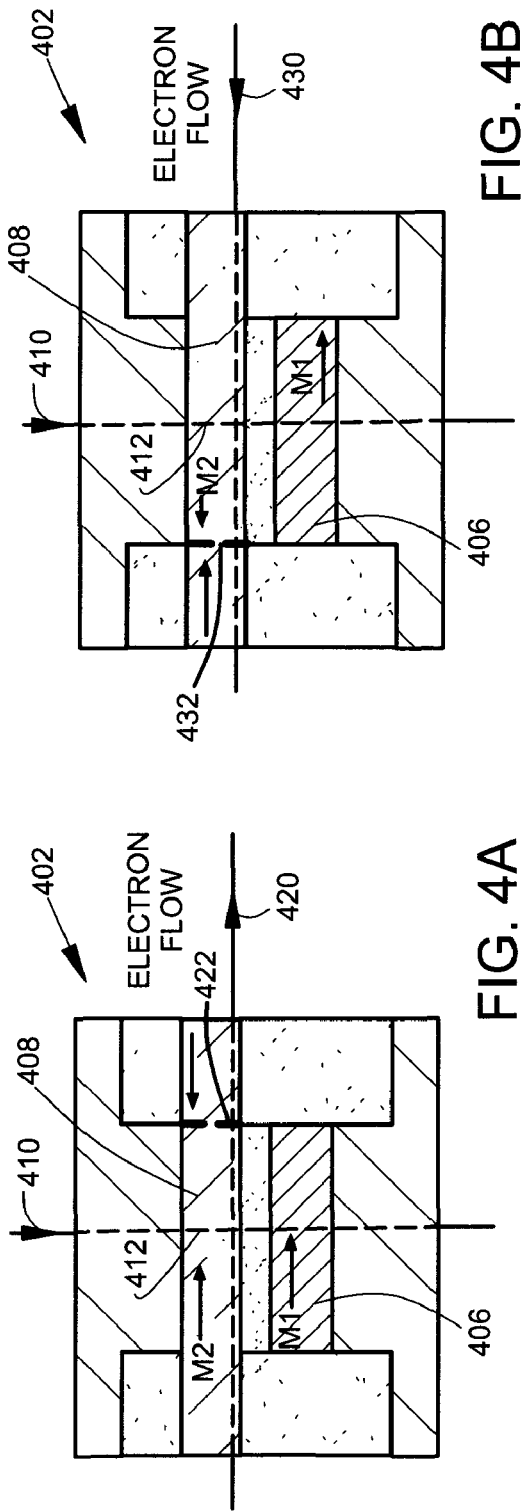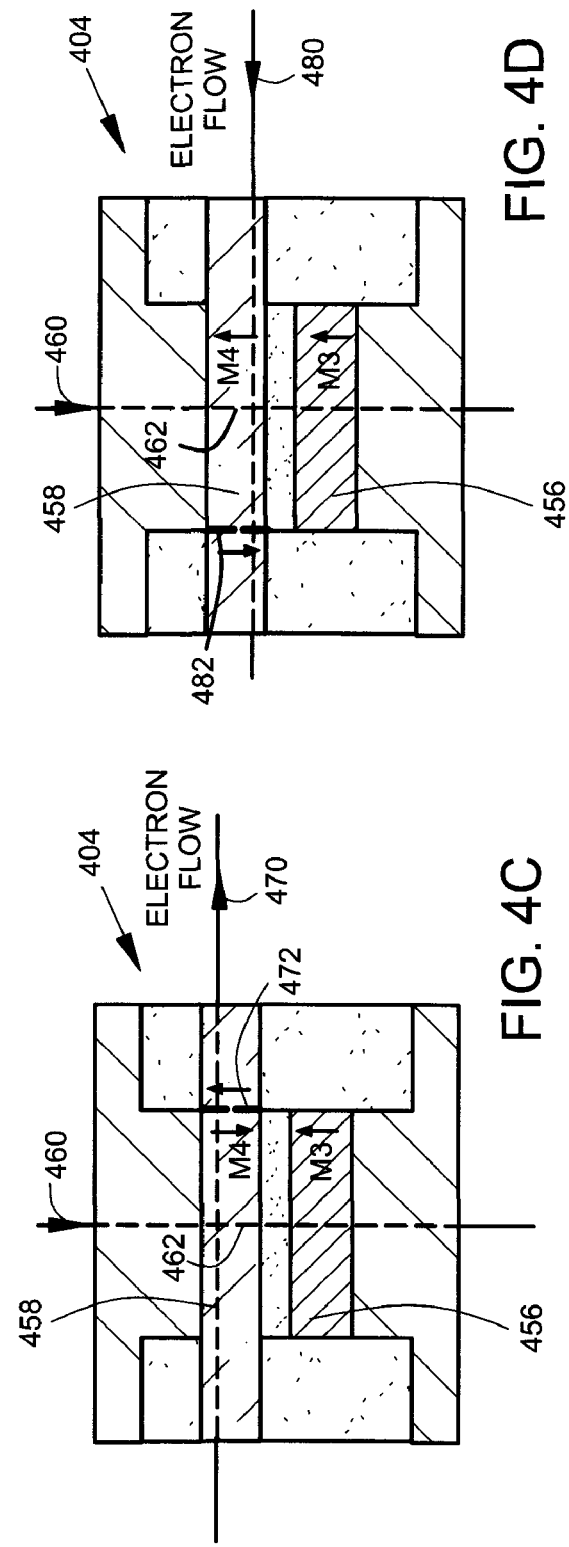
FIG. 4A FIG. 4B FIG. 4C FIG. 4D

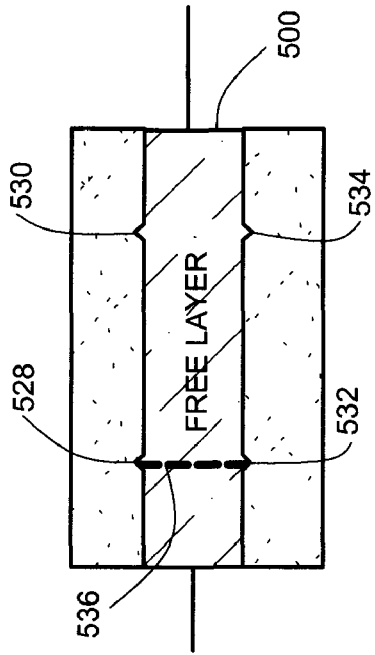
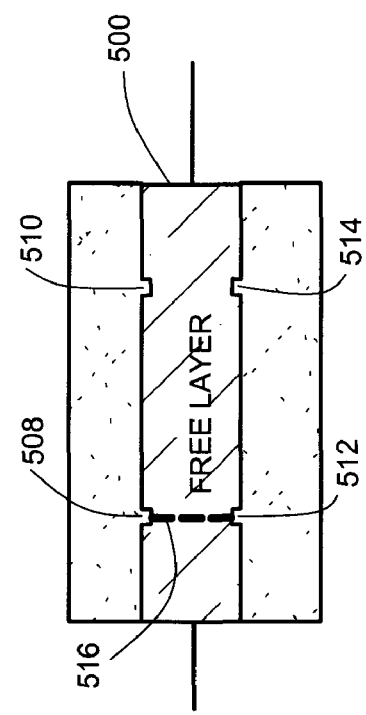
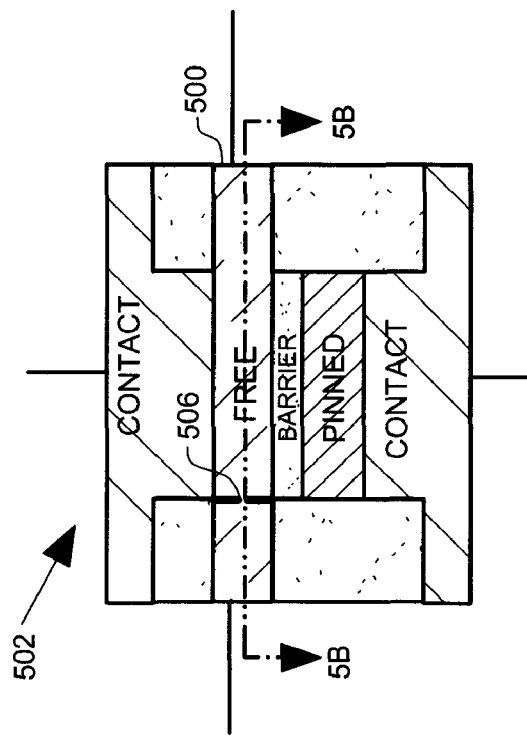

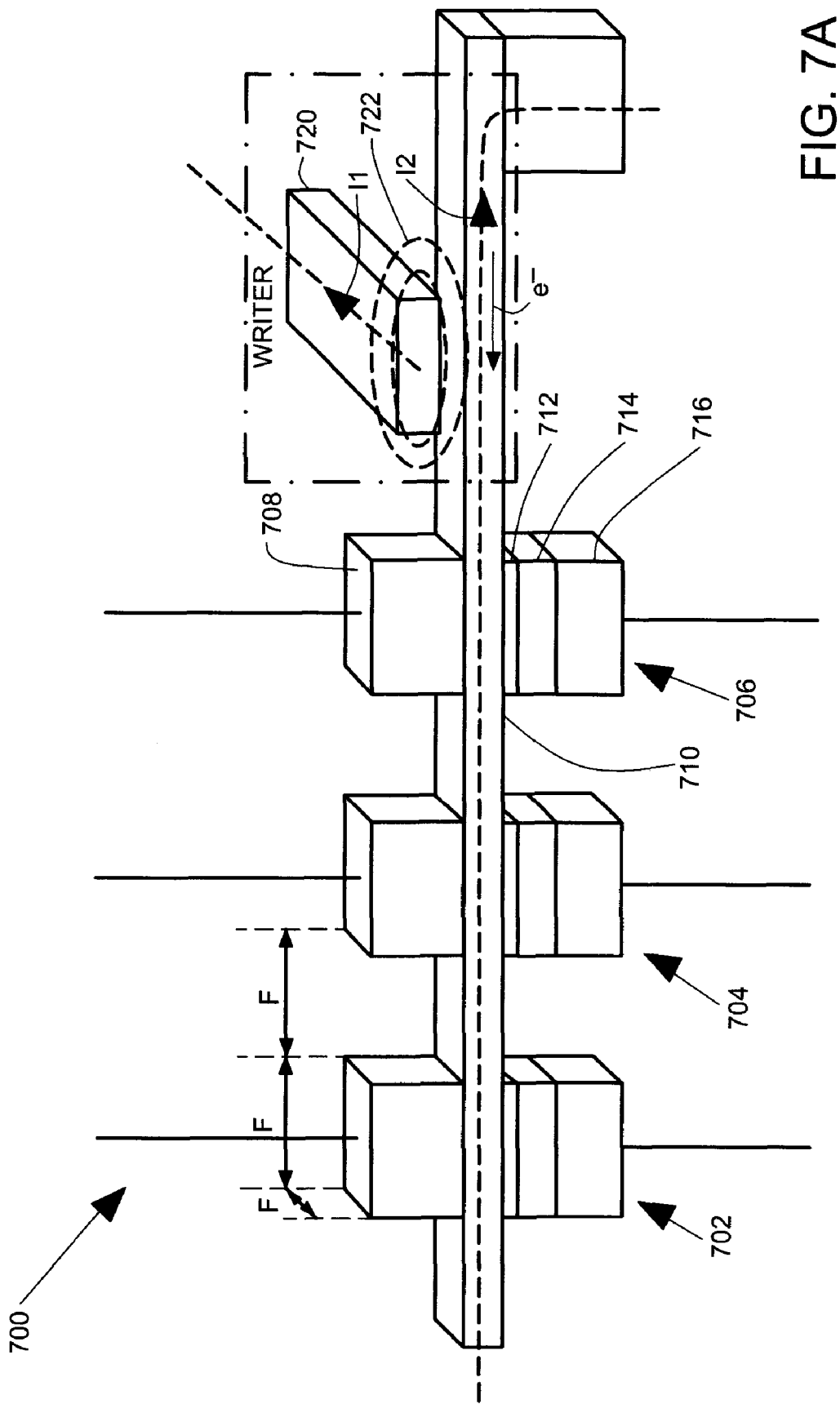

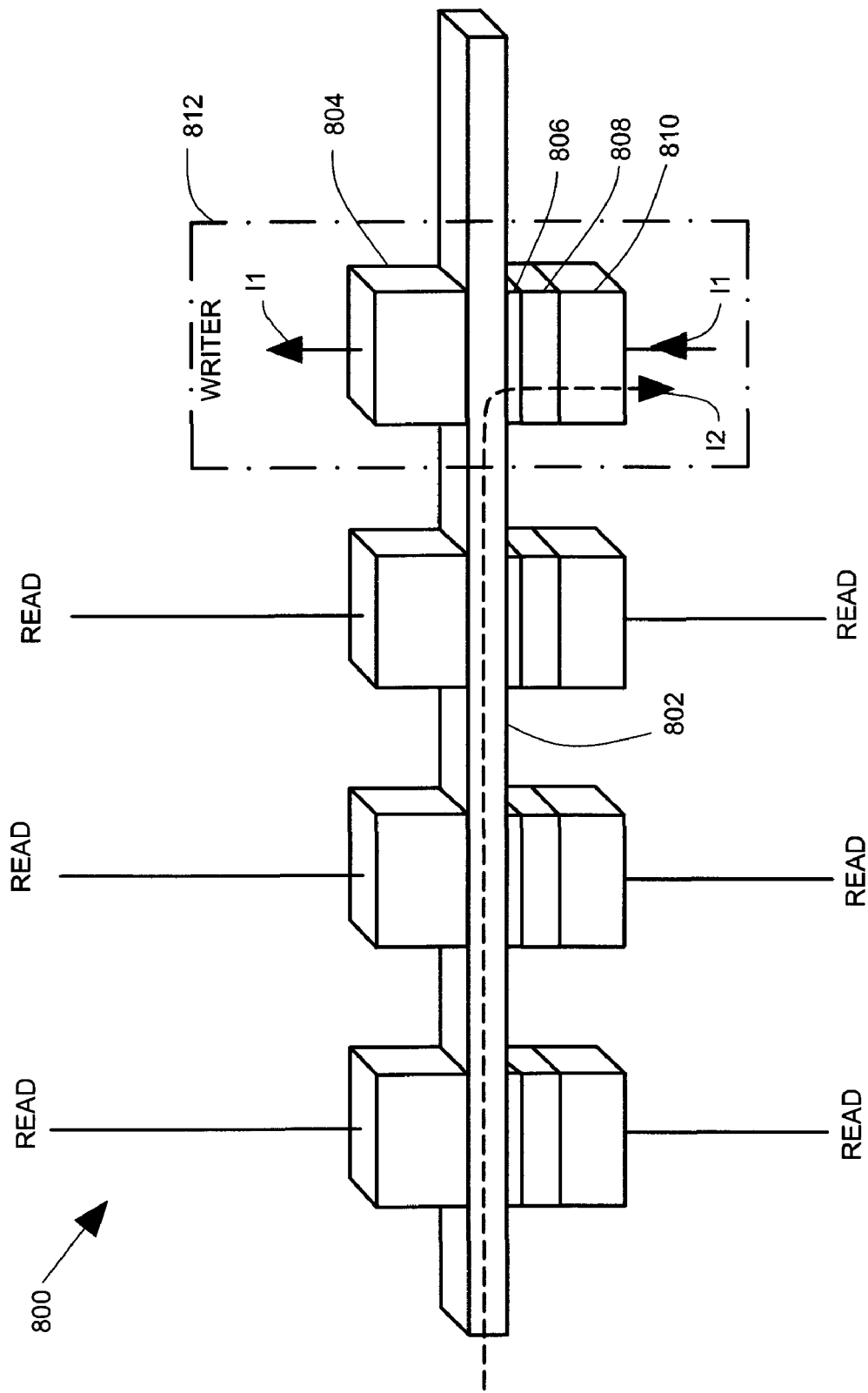

MAGNETORESISTIVE MEMORY ELEMENTS WITH SEPARATE READ AND WRITE CURRENT PATHS

BACKGROUND

Non-volatile solid state data storage is an advancing technology for future data storage applications. Solid state data storage devices are typically better suited than disc drives for applications that require small form factors, low power consumption, and robust mechanical shock resistance. Among various silicon-based solid state data storage technologies, flash memory is non-volatile and offers very high storage densities. However, flash memory performance is limited by its long write times (about 0.1-1 microsecond) and a limited number of data overwrites that can be successfully achieved. One non-volatile solid state technology vying to compete with flash memory is magnetic random access memory (MRAM). Unlike flash memory, MRAM has infinite write endurance and orders of magnitude faster write times (about 1-10 nanosecond). MRAM has a potential to achieve the same areal density and cost as flash memory when the magnetic bits are written in an MRAM cell via spin torque instead of with externally applied magnetic fields. However, there are unsolved problems with cell-to-cell process variations in spin torque MRAM cells that limit the ability to make large MRAM arrays.

Embodiments of the present invention provide solutions to these and other problems, and offer other advantages over the prior art.

SUMMARY

Disclosed is a magnetoresistive memory element. The magnetoresistive memory element comprises a free layer. The magnetoresistive memory element comprises a write current path aligned with a free layer plane.

The magnetoresistive memory element comprises a pinned layer. The pinned layer and the free layer have magnetization directions aligned with one another.

The magnetoresistive memory element comprises a barrier layer. The barrier layer is disposed between the free layer and the pinned layer.

The free, barrier and pinned layers, taken together, form a layer stack having a read current path that extends through the layer stack and that is not aligned with the write current path in the free layer.

According to one aspect, multiple magnetoresistive memory elements are formed into a memory array. According to another aspect, a writer couples to the free layer and providing a series of domains moved by spin torque to the free layer. According to another aspect, a read circuit provides a read current to the read current path. Other features and benefits that characterize embodiments of the present invention will be apparent upon reading the following detailed description and review of the associated drawings.

BRIEF DESCRIPTION OF THE DRAWINGS

FIG. 1B illustrates an exemplary statistical frequency distribution of cell switching current $I_S$ for an array of MRAM cells such as shown in FIG. 1A.

FIG. 1C illustrates an enlarged view of a portion of the frequency distribution of FIG. 1B in which switching current $I_S$ is less than read current $I_{READ}$.

FIGS. 4A, 4B, 4C, 4D illustrate examples of spin-torque based MRAM cells which have read current paths that are not aligned with write current paths through free layers.

FIGS. 5A, 5B, 5C, 5D illustrate structural features of free layers that stabilize locations of domain walls in free layers.

FIGS. 7A, 7B, 7C illustrate cross-sections of arrays of spin-torque based MRAM cells in which read current paths are not aligned with write current paths in free layers.

FIG. 8 illustrates a cross-section of an array of spin-torque based MRAM cells in which a read current path is not aligned with a write current path in a free layer.

DETAILED DESCRIPTION

In the aspects described below in connection with FIGS. 2-11, spin torque-based MRAM cells have different, non-aligned read and write current paths through free layers in the MRAM cells. Spin torque due to a current along a write path moves magnetic domains along a row of MRAM cells during writing. Current perpendicular to plane magnetoresistance (CPP MR) is used for readback by a read current along a read current path that is different than the write current path.

As described below in connection with FIG. 2, read and write current paths in a free layer are different from one another. The write mechanism is spin torque and, hence, exploits the current efficiency and scaling benefits associated with spin torque. However, the magnetization is set by driving a magnetic domain wall through the region overlapping with the pinned reference layer, in a magnetic shift register (racetrack memory) configuration. The different paths allow read and write current paths to be independently optimized so that an array of MRAM cells can be designed in which the MRAM cells are immune from spin torque induced magnetization reversal by a readback current. The problem with magnetization reversal by a readback current is described below in connection with FIGS. 1A, 1B, 1C.

Figure 1A:
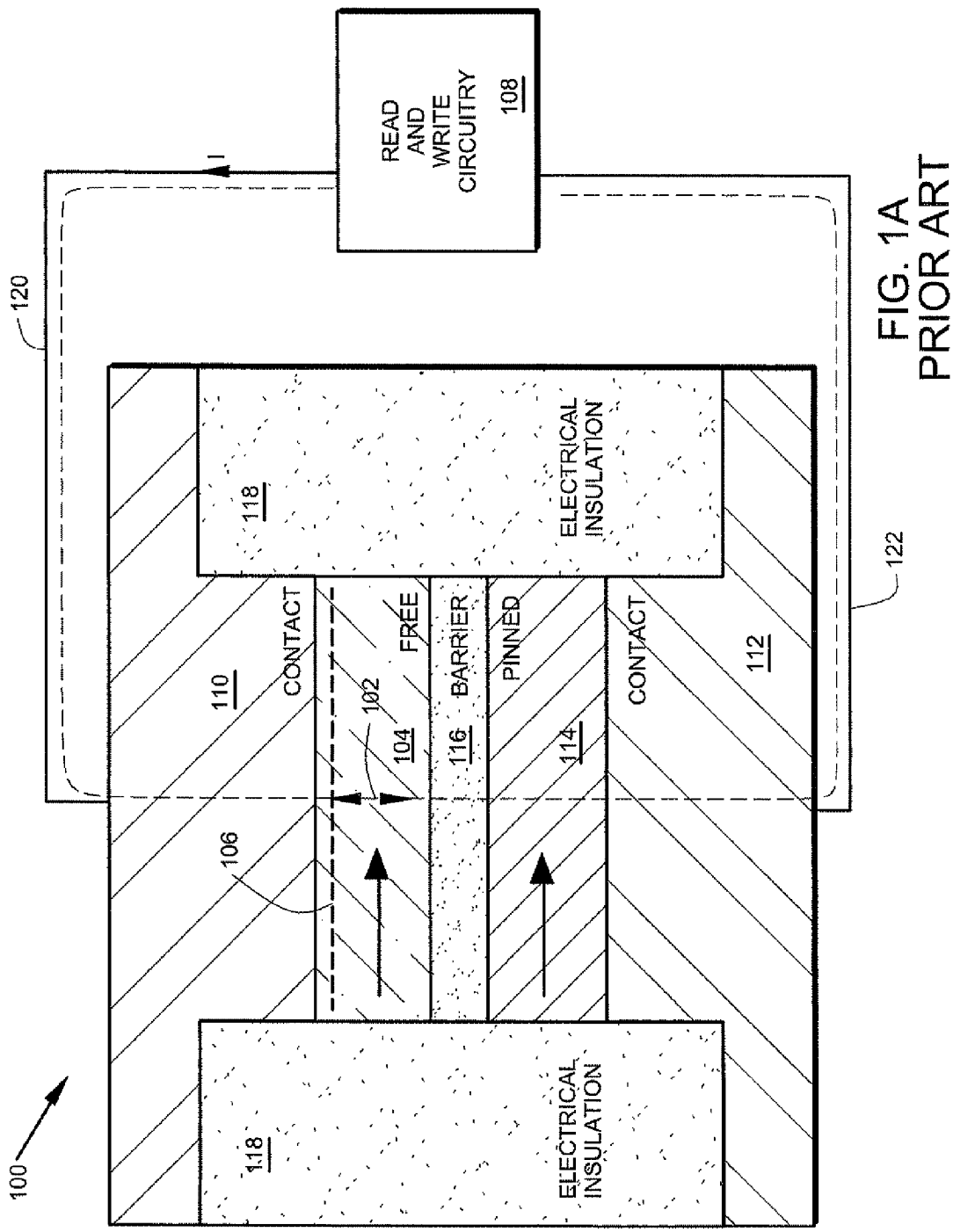
FIG. 1A illustrates an illustrative example of a spin-torque based MRAM cell that has a single, perpendicular-to-plane current path that is in the same path for both read and write currents.

FIG. 1A illustrates an exemplary spin-torque based MRAM cell 100, also called a magnetoresistive memory element 100, which has a single, perpendicular-to-plane read and write current path 102 that is aligned in the same direction for both read and write currents in a free layer 104. Read and write currents flow along a common current path 102 through the free layer 104.

The free layer 104 has a free layer plane 106. The read and write current path 102 is perpendicular to the free layer plane 106. The read and write current path 102 is not aligned (i.e., not parallel) with the free layer plane 106. Read and write currents are generated by read and write circuitry 108 that is connected to a top contact 110 and a bottom contact 112 in the magnetoresistive memory element 100.

The magnetoresistive memory element 100 comprises a pinned layer 114. The pinned layer 114 and the free layer 104 have magnetization directions (indicated by arrows in the layers 104, 114) that are aligned with one another. With respect to alignment of magnetization directions, the term "aligned" includes both parallel and antiparallel alignments.

The magnetoresistive memory element 100 comprises a barrier layer 116 disposed between the free layer 104 and the pinned layer 114. The free layer 104, the barrier layer 116 and the pinned layer 114, taken together, form a layer stack that has a common read and write current path 102 that extends through the layer stack. The read and write currents share the same common path 102 through the free layer 104. The direction of the read current and the direction of the write current are the same in the free layer 104. The read current and the write current are aligned (parallel) with one another in the free layer.

The magnetoresistive memory element 100 receives a current level $I_{WRITE}$ from circuitry 108 for writing a bit of data to the free layer 104. The magnetoresistive memory element receives a current level $I_{READ}$, less than $I_{WRITE}$, from circuitry 108 for reading a bit of data from the free layer 104. The magnetoresistive memory element 100 has a switching current level $I_S$ at which the bit of data in free layer 104 switches.

An electrical insulation layer 118 electrically isolates the magnetoresistive memory element 100 from adjacent magnetoresistive memory elements in an array. It will be understood that, while the current path 102 is graphically illustrated as a central line, the current path 102 is distributed across the free layer 102 in a direction indicated by the central line. It will be understood that connection lines 120, 122 are representative of row and column addressing conductors that provide a read or write current I when the memory element 100 is addressed. It will be understood that a data bit is stored in the magnetoresistive memory element 100 as a magnetic spin direction in the free layer 104.

It will be understood by those skilled in the art that an array of magnetoresistive memory elements, such as exemplary magnetoresistive memory element 100, will be all be connected by row and column addressing conductors to a single, common circuit 108 and that all of the memory elements in the array will receive the same current levels $I_{READ}$ and $I_{WRITE}$ from the circuit 108 that is common to all of the magnetoresistive memory elements in the array. It will be understood by those skilled in the art that there are processing variations that occur during fabrication of an MRAM array that lead to statistical variation of the switching current level $I_S$ from cell to cell in the MRAM array. Despite efforts to make a uniform array, different magnetoresistive memory elements in the MRAM array have different switching current levels $I_S$ as explained in more detail below in connection with FIGS. 1B, 1C.

FIG. 1B illustrates an exemplary statistical frequency distribution of cell switching current levels $I_S$ for an array of MRAM cells such as shown in FIG. 1A. A vertical axis 152 represent statistical frequency of occurrence of the switching current level $I_S$, and a horizontal axis 154 represents the switching current level $I_S$. A curved line represents a statistical frequency distribution 156 of the switching current level $I_S$. In the example illustrated in FIG. 1B, the frequency distribution 156 is substantially a normal frequency distribution as illustrated. A mean value 158 of the frequency distribution 156 has a peak at a nominal peak statistical frequency 1N=0.3989. The whole distribution of switching current $I_S$ for the array is substantially less than a write current level $I_{WRITE}$ and data can be written in substantially all of the MRAM cells using the write current level $I_{WRITE}$. According to one aspect, the write current level $I_{WRITE}$ provided for the array is adjusted in circuitry 108 (FIG. 1A) so that substantially all cells in the array can be written to reliably. The frequency distribution 156, however, has a statistical tail of outlier cells in a region 160 for which the switching current $I_S$ is less than the read current $I_{READ}$. According to one aspect, the read current level $I_{READ}$ is adjusted in circuitry 108 (FIG. 1A) so that signal to noise ratio during read operations are optimized. The region 160 is shown in an enlarged scale in FIG. 1C.

FIG. 1C illustrates an enlarged view of the portion 160 of the frequency distribution 156 of FIG. 1B in which $I_S < I_{READ}$. As illustrated in FIG. 1C, there are a significant number of outlier cells in region 158. In these outlier cells, the read current level $I_{READ}$ is more than the switching current level $I_S$. The switching level $I_S$ is sufficiently low in these outlier cells that a read operation will result in an unintended, erroneous write operation. According to one aspect, lowering the read current level $I_{READ}$ to eliminate outliers is not a viable solution because it degrades signal to noise ratio excessively. A solution is needed for this problem of outliers, and aspects of magnetoresistive memory elements which can overcome this problem are described below in connection with FIGS. 2-11.

Spin torque based MRAM as shown in FIG. 1A has a simple structure because the same structure is used for both writing and reading. However, this also induces a constraint on the design. Electrical current flows perpendicular to the plane during both write and read operations. Inevitably, there is a distribution of thresholds of switching currents $I_S$ that induce the magnetization in each cell to reverse its orientation. The write current is chosen to be sufficiently large to switch every bit. The read current is ideally as large as possible so that the signal-to-noise (at least for an individual cell) can be maximized. However, the tail (FIG. 1C) in the switching current distribution restricts the upper limit of the read current. Since solid state memory requires extremely robust designs that prevent the unintentional overwriting of data during readback, there is a need for a solution to the problem with the structure shown in FIG. 1A when it is used as a cell in a large array of cells where there is statistical variation of individual cell switching characteristics.

Figure 2:
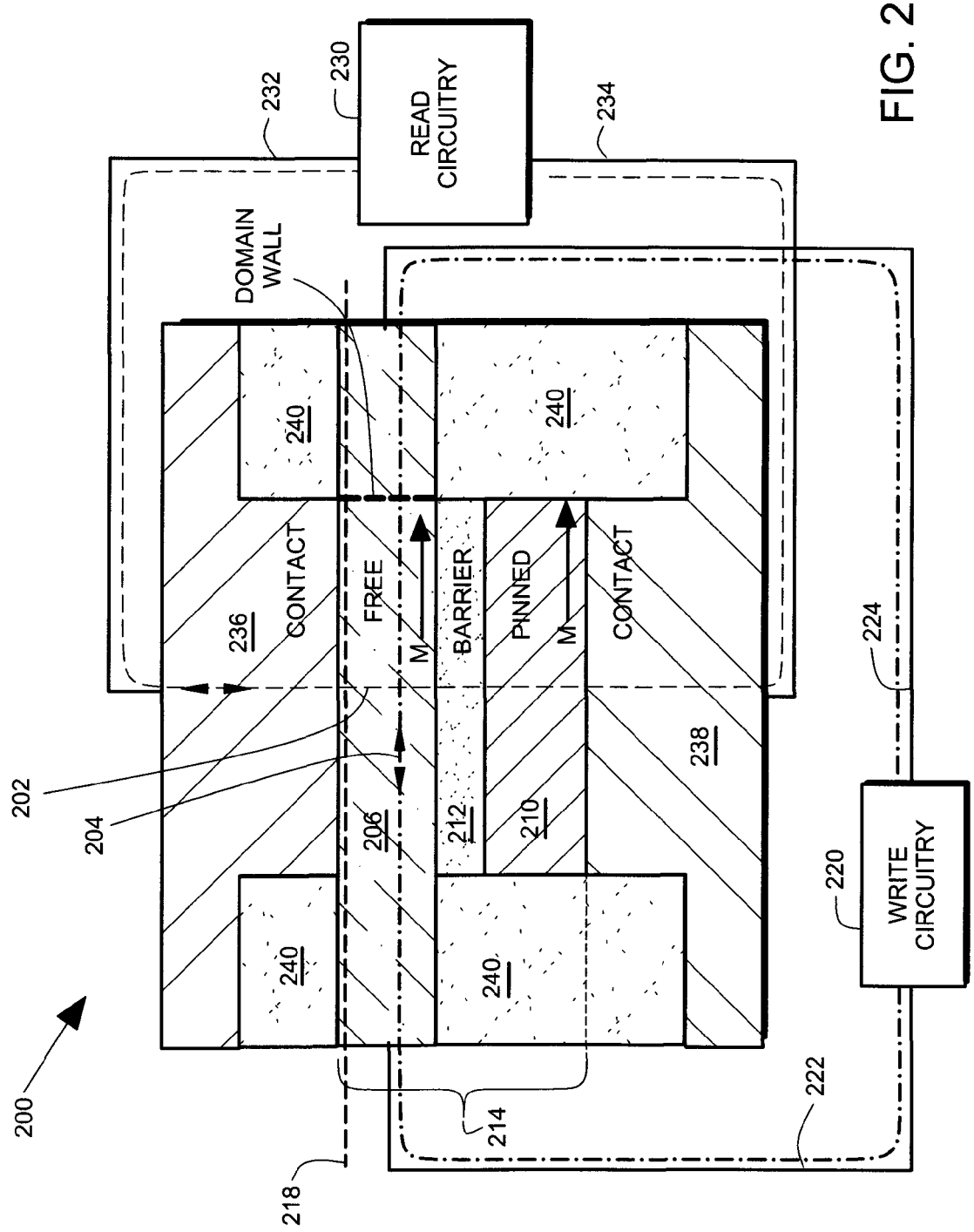
FIG. 2 illustrates an exemplary spin-torque based MRAM cell which has a read current path that is not aligned with a write current path in a free layer.

FIG. 2 illustrates an exemplary spin-torque based MRAM cell 200 (also called magnetoresistive memory element 200) which has a read current path 202 that is not aligned with a write current path 204 in a free layer 206. The free layer 206 lies in a free layer plane 218. The write current path 204 is aligned (parallel) with the free layer plane 218. The read current path 202 is perpendicular to the free layer plane 218.

The magnetoresistive memory element 200 comprises a pinned layer 210. The pinned layer 210 and the free layer 206 have magnetization directions (indicated by arrows M) that are aligned (parallel) with one another. The magnetoresistive memory element 200 comprises a barrier layer 212. The barrier layer 212 is disposed between the free layer 206 and the pinned layer 210.

The free layer 206, the barrier layer 212, and the pinned layer 210 together form a layer stack 214. The read current path 202 extends through the layer stack 214 and is not aligned with the write current path 204 in the free layer 206.

Write circuitry 220 provides write current along the write current path 204 through the free layer 206. The write circuitry 220 is connected to the free layer 206 by conductors 222, 224. Read circuitry 230 provides read current along the read current path 202 through the layer stack 214. The read circuitry 230 is connected to the layer stack through conductors 232, 234 and contact layers 236, 238. Electrical insulation 240 isolates the magnetoresistive memory element 200 from adjacent memory elements in an array.

A data bit is stored in the direction of magnetization of the free layer 206. The pinned layer 210 comprises a ferromagnetic layer. According to one aspect, the pinned layer 210 comprises a single ferromagnetic layer or a synthetic antiferromagnetic layer. According to another aspect, the pinned layer 210 is patterned or extended beyond the layer stack 214. According to yet another aspect, the pinned layer 214 can be exchange coupled to a permanent magnet layer or an antiferromagnetic layer (not illustrated).

Writing is achieved by displacing a domain wall via spin torque from a write current-in plane (parallel to plane 218) in the free layer 206. The free layer 206 is perpendicular relative to the read current path 202 so that the magnetization M in the free layer 206 does not get unintentionally re-oriented by the spin torque from the read current that is perpendicular-to-plane (perpendicular to plane 218). Various know parameters of magnetoresistive memory elements such as layer thicknesses, $M_S$, $H_K$, LLG, α can be adjusted to tune the performance of the magnetoresistive memory element 200.

It is understood that the conductors 232, 234 comprise read addressing busses. It is understood that the free layer 206 can extend from cell to cell along a row (or a column) of an MRAM array to provide write current to an addressed row of the array. The write current moves a series of domains along the row to place domains with selected orientations in particular cells. Exemplary writers which generate the series of domains are described below in connection with FIGS. 7A, 7B, 7C, 8, 9A, 9B, 9C. Electron flow along the write current path 204 moves the series of domains along the free layer 206 which extends along a row of MRAM cells such as MRAM cell 200. The motion of domains is described below in connection with FIGS. 3A, 3B, 3C.

A magnetic domain (data bit) stored in the free layer 206 MRAM cell 200 is read by a read current along the read current path 202. The magnetic domain is not sensitive to being switched by the read current because the read current is along a read current path that is perpendicular to the free layer plane 218. Higher levels of read current, and higher signal to noise ratios can be used without concern that a read current may accidentally switch a domain in an outlier MRAM cell. The problem described above in connection with FIGS. 1A, 1B, 1C is avoided by providing read and write current paths that are not aligned with one another in the free layer 206.

Figure 3A:
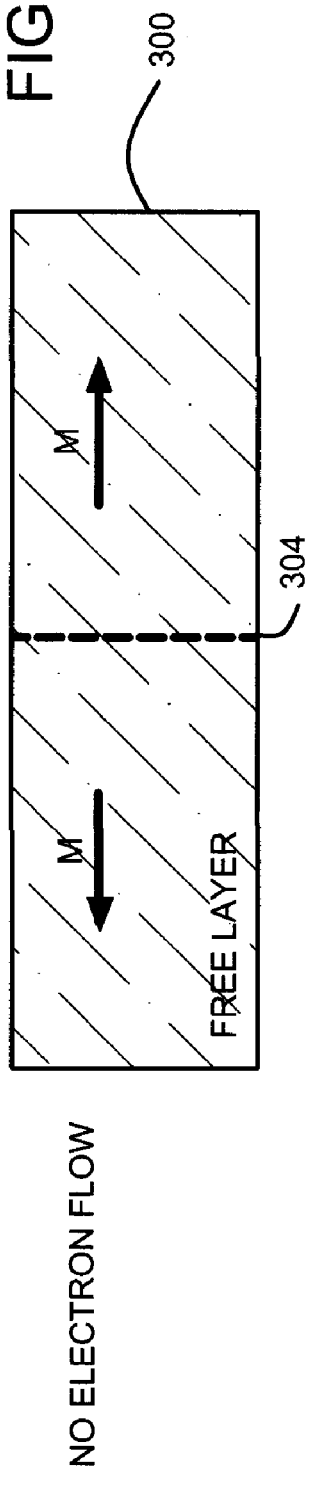
FIGS. 3A, 3B, 3C, illustrate motion of a domain wall in a free layer in a direction of electron flow through the free layer.
Figure 3B:
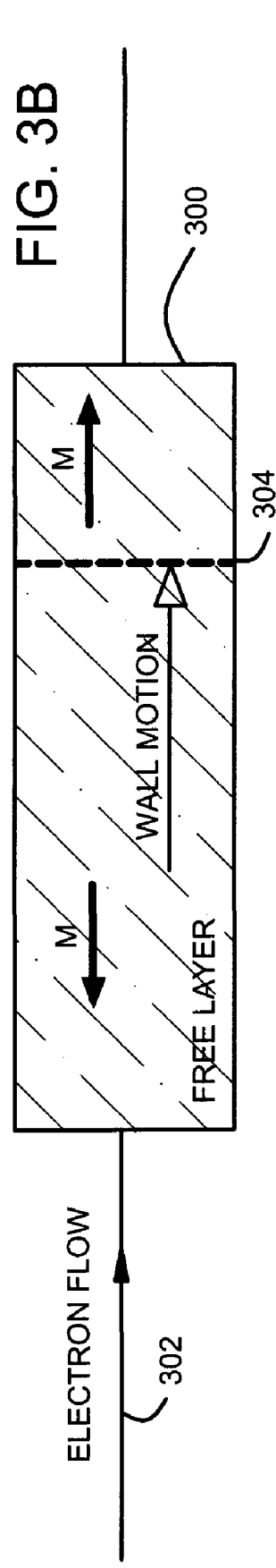
Figure 3C:
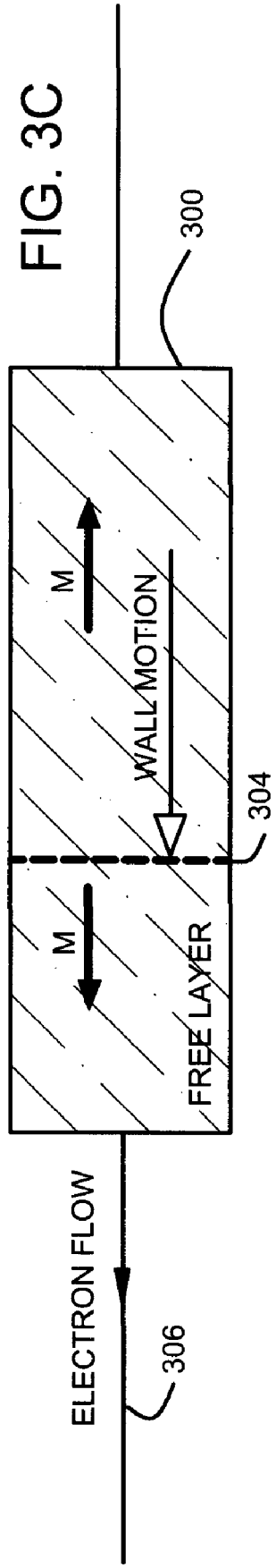

FIGS. 3A, 3B, 3C, illustrate magnetization directions and motion of a domain wall in a free layer 300 as a function of electron flow through the free layer 300. In FIG. 3A, there is no externally applied electron flow to the free layer 300, and a domain wall 304 is located at a non-moving quiescent central location. In FIG. 3B, an externally applied electron flow 302 is provided from left to right, and the domain wall 304 moves in the direction of the electron flow to a location that is to the right of center. In FIG. 3C, an externally applied electron flow 306 is provided from right to left, and the domain wall 304 moves in the direction of the electron flow to a location that is to the left of center. It is understood that electron flow is in a direction that is opposite to a defined direction of conventional current flow. When a write current, expressed as conventional current flow, is used to move the domain wall 304, the write current flows in a direction that is opposite to the direction of desired domain wall motion.

FIGS. 4A, 4B, 4C, 4D illustrate examples of spin-torque based MRAM cells 402, 404 which have read current paths that are not aligned with write current paths through free layers. The MRAM cells 402, 404 are similar to the MRAM cell 200 illustrated in FIG. 2. FIGS. 4A, 4B, 4C, 4D illustrate that the direction of magnetization can be parallel to plane or perpendicular to plane, while maintaining non-aligned read and write current paths in free layers.

In FIGS. 4A, 4B, the spin-torque based MRAM cell 402 is illustrated. Magnetization M1 in a pinned layer 406 is aligned parallel-to-plane. Magnetization M2 in a free layer 408 is also aligned parallel to plane. A read current 410 flows along a path 412 that is perpendicular-to-plane in the free layer 408. In FIG. 4A, a write electron flow 420 flows from left to right and moves a domain wall 422 from left to right. In FIG. 4B, a write electron flow 430 flows from right to left and moves a domain wall 432 from right to left.

In FIGS. 4C, 4D, the spin-torque based MRAM cell 404 is illustrated. Magnetization M3 in a pinned layer 456 is aligned perpendicular-to-plane. Magnetization M4 in a free layer 458 is also aligned perpendicular to plane. A read current 460 flows along a path 462 that is perpendicular-to-plane in a free layer 458. In FIG. 4C, a write electron flow 470 flows from left to right and moves a domain wall 472 from left to right. In FIG. 4D, a write electron flow 480 flows from right to left and moves a domain wall 482 from right to left.

FIGS. 5A, 5B, 5C, 5D illustrate structural features of free layers that stabilize domain walls in free layers.

FIG. 5A illustrates an elevational cross-section view of a spin torque based MRAM cell 502. The MRAM cell 502 is similar to the MRAM cell 200 illustrated in FIG. 2. The MRAM cell 502 comprises a free layer 500 that includes a domain wall 506. A top view cross-section line of the free layer 502 is indicated by line 5B-5B in FIG. 5A.

FIG. 5B illustrates, in a top cross-sectional view taken along line 5B-5B in FIG. 5A, a first aspect of structural features that stabilize locations of domain walls in the free layer 500. In FIG. 5B, the free layer 500 is provided with generally rectangular notches 508, 510, 512, 514 that locally narrow a width of the free layer 500. A domain wall 516 has a location that is stabilized between notches 508, 512 as illustrated, or between notches 510, 514 (not illustrated). The stabilization of a location of the domain wall 516 enhances the alignment of a domain in the MRAM cell 502.

FIG. 5C illustrates, in a top cross-sectional view taken along line 5B-5B in FIG. 5A, a second aspect of structural features that stabilize locations of domain walls in the free layer 500. In FIG. 5C, the free layer 500 is provided with generally triangular notches 528, 530, 532, 534 that locally enlarge a width of the free layer 500. A domain wall 536 has a location that is stabilized between notches 528, 532 as illustrated, or between notches 530, 534 (not illustrated). The stabilization of a location of the domain wall 536 enhances the alignment of a domain in the MRAM cell 502.

FIG. 5D illustrates, in a top cross-sectional view taken along line 5B-5B in FIG. 5A, a third aspect of structural features that stabilize locations of domain walls in the free layer 500. In FIG. 5D, the free layer 500 is provided with generally triangular notches 548, 550, 552, 554 that locally narrow a width of the free layer 500. A domain wall 556 has a location that is stabilized between notches 550, 554 as illustrated, or between notches 548, 552 (not illustrated). The stabilization of a location of the domain wall 516 enhances the alignment of a domain in the MRAM cell 502.

The aspects shown in FIG. 5B, 5C and 5D are merely exemplary, and other shapes of features in the free layer 500 can be used to stabilize locations of domain walls. According to one aspect, domain walls are pinned in such a way so that the free layer 500 is uniformly magnetized in the region where the free layer 500 overlaps a pinned layer. In general, any known feature that produces a stable energy minimum at a desired domain wall location can be used. As an alternative to notches (inward or outward) and indentations, locations on the free layer 500 can be provided with various known discontinuities to stabilize locations of domain walls. These discontinuities can comprise shaping the free layer 500, providing material variations in the free layer 500 or other known discontinuities.

Figure 6A:
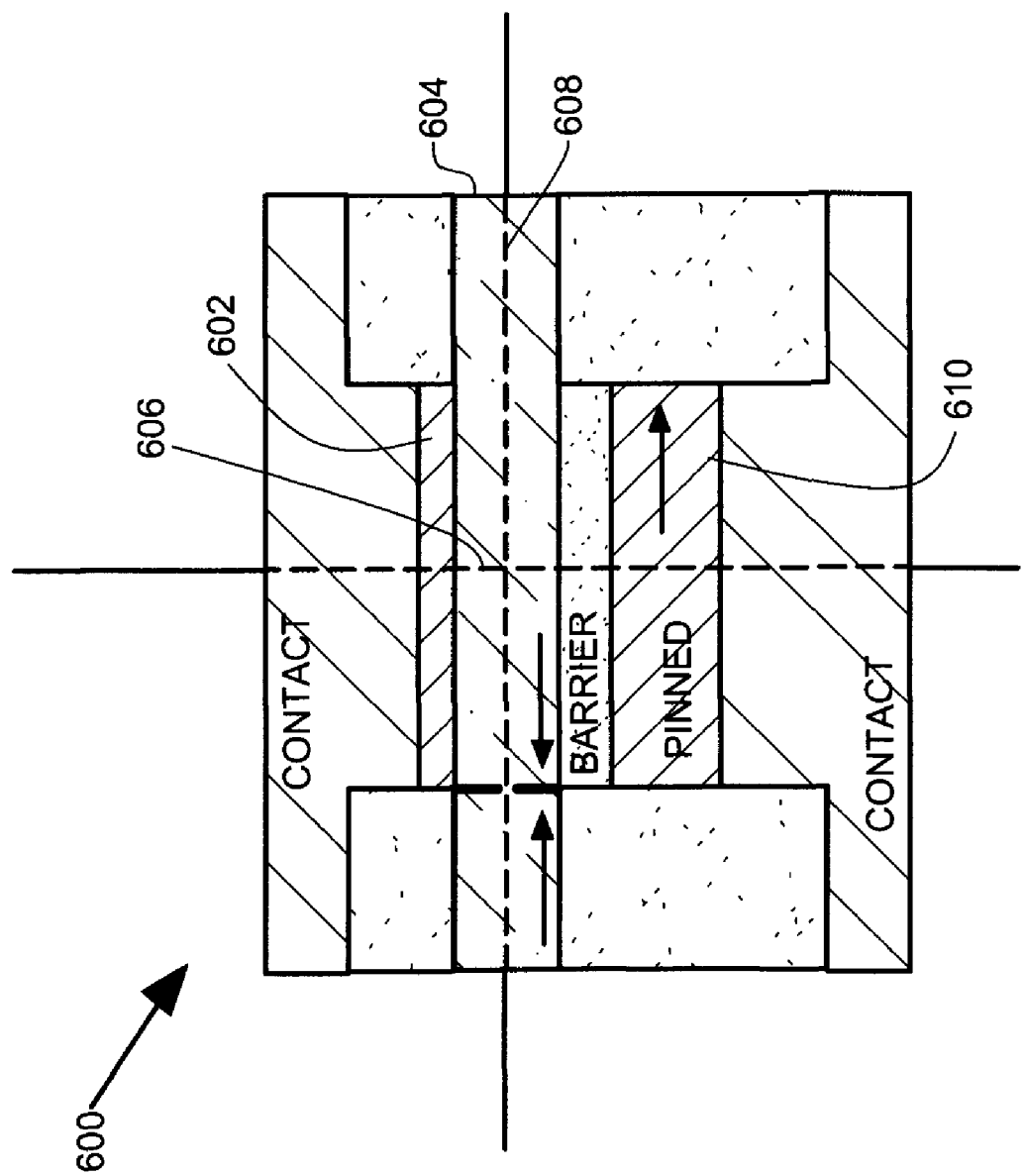
FIG. 6A illustrates a spin-torque based MRAM cell that includes a temperature sensitive layer adjacent a free layer.

FIG. 6A illustrates a spin-torque based MRAM cell 600 that includes a temperature sensitive alignment layer 602 adjacent a free layer 604. A read current path 606 is not aligned with a write current path 608 in the free layer 604. MRAM cell 600 is similar to MRAM cell 200 except that MRAM cell 600 includes the alignment layer 602 adjacent the free layer 604. The alignment layer 602 comprises a magnetic layer that exchange couples with the free layer 604. The alignment layer 602 aligns the free layer 604. The alignment layer 602 comprises a material that has temperature sensitive magnetic properties.

According to one aspect, the alignment layer 602 comprises a temperature sensitive material that becomes ferromagnetic above room temperature. During a write interval, joule heating from a write current heats the alignment layer 602, and the alignment layer becomes ferromagnetic during the write interval. After the desired magnetic domain moves into the MRAM cell 600, the write current is removed and the alignment layer 602 cools and becomes antiferromagnetic to stabilize the domain location. According to another aspect, the alignment layer 602 comprises FeRh.

According to yet another aspect, the alignment layer 602 comprises a temperature sensitive antiferromagnetic material. During a write interval, joule heating drives the antiferromagnetic material above its blocking temperature, allowing a domain to be pushed into the MRAM cell 600 via spin torque. Removal of the write current allows the antiferromagnetic material to cool and stabilize the free layer 604 in the region the overlaps the pinned (reference) layer 610. According to one aspect, the alignment layer 602 comprises IrMn.

Figure 6B:
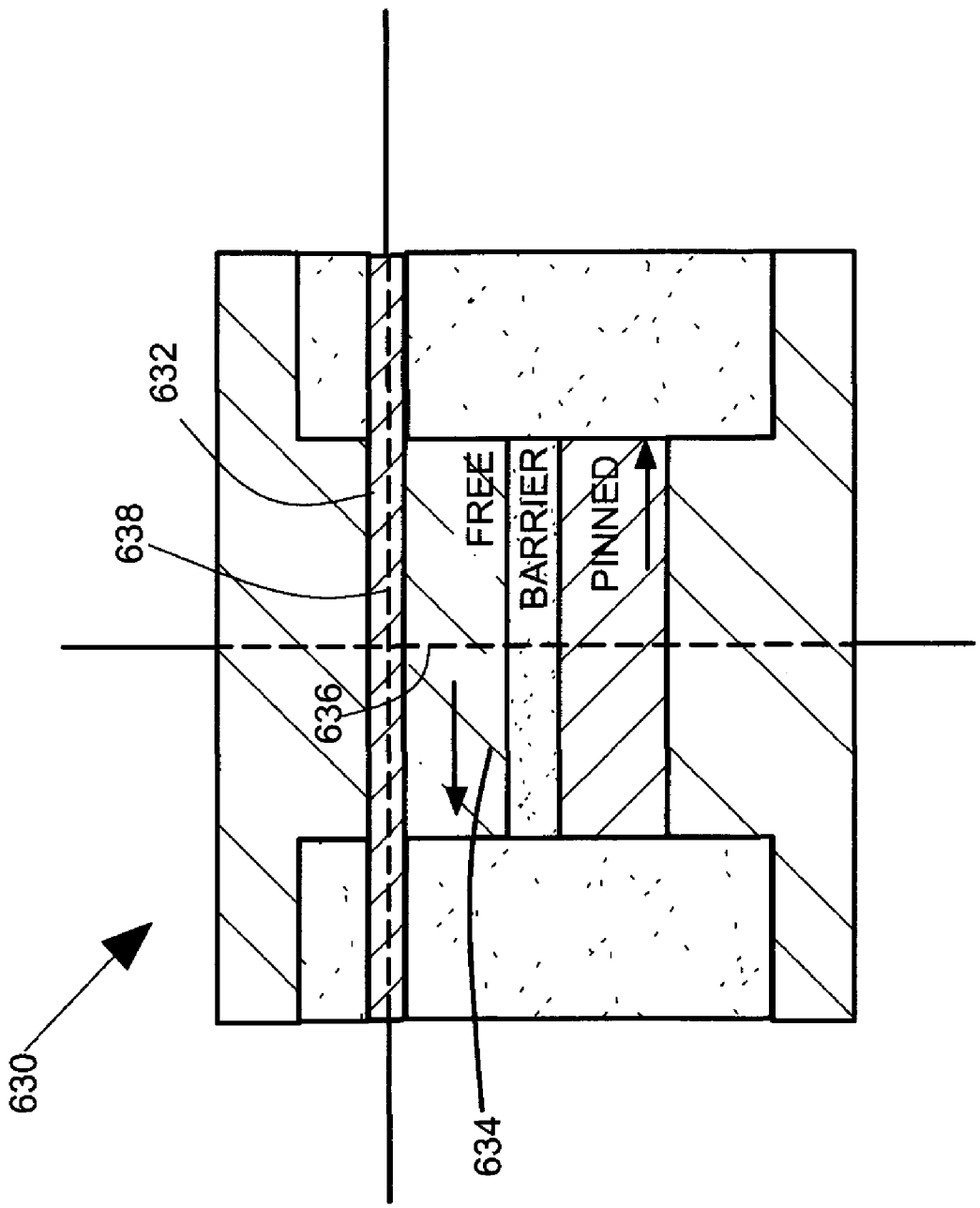
FIG. 6B, 6C illustrate spin-torque based MRAM cells that include a temperature sensitive write current conductors adjacent free layers.

FIG. 6B illustrates a spin-torque based MRAM cell 630 that includes a temperature sensitive alignment layer 632 adjacent a free layer 634. The temperature sensitive alignment layer 632 comprises a second free layer that, in combination with the free layer 634 forms a combined free layer in the MRAM cell 630. A read current path 636 is not aligned with a write current path 638 in the free layer 634. MRAM cell 630 is similar to MRAM cell 200 except that MRAM cell 630 includes the alignment layer 632 adjacent the free layer 634, and the alignment layer 632 conducts the write current from cell to cell in an MRAM array. The alignment layer 632 comprises a magnetic layer that exchange couples with the free layer 604.

The alignment layer 632 forms a continuous conductor that runs from MRAM cell to MRAM cell in a row of MRAM cells, and is exchange coupled to the switchable free layer 634. Joule heating by the write current drives the alignment layer 632 into a ferromagnetic phase, which allows a domain wall to propagate through the alignment layer 632. After the write current is removed, the alignment layer 632 cools to its antiferromagnetic phase at room temperature that helps stabilize the magnetization of the free layer 634. According to one aspect, the alignment layer 634 comprises FeRh.

Figure 6C:
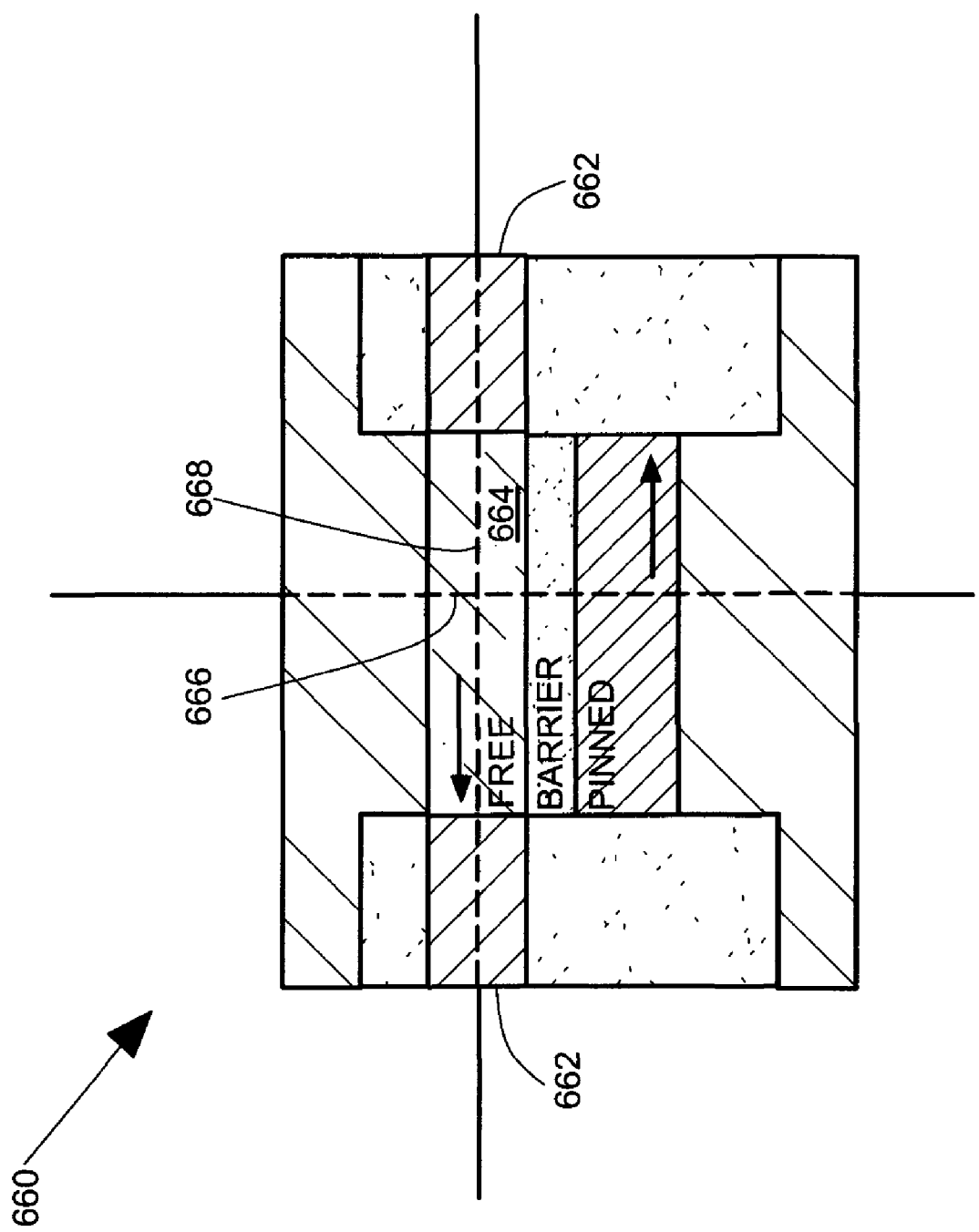

FIG. 6C illustrates a spin-torque based MRAM cell 660 that includes a temperature sensitive alignment layer 662 adjacent a free layer 664. A read current path 666 is not aligned with a write current path 668 in the free layer 664. MRAM cell 660 is similar to MRAM cell 200 except that MRAM cell 660 includes the alignment layer 662 adjacent the free layer 664 and the alignment layer 662 conducts the write current from cell to cell in an MRAM array. The alignment layer 662 comprises a magnetic layer that exchange couples with the free layer 664.

The alignment layer 662 forms a discontinuous conductor and provides a write current path between MRAM cells in an array. The alignment layer 662 is exchange coupled to the switchable free layer 664. Joule heating by the write current drives the alignment layer 662 into a ferromagnetic phase, which allows a domain wall to propagate through the alignment layer 662 to the free layer 664. After the write current is removed, the alignment layer 662 cools to its antiferromagnetic phase at room temperature that helps stabilize the magnetization of the free layer 664. According to one aspect, the alignment layer 664 comprises FeRh.

Figure 7B:
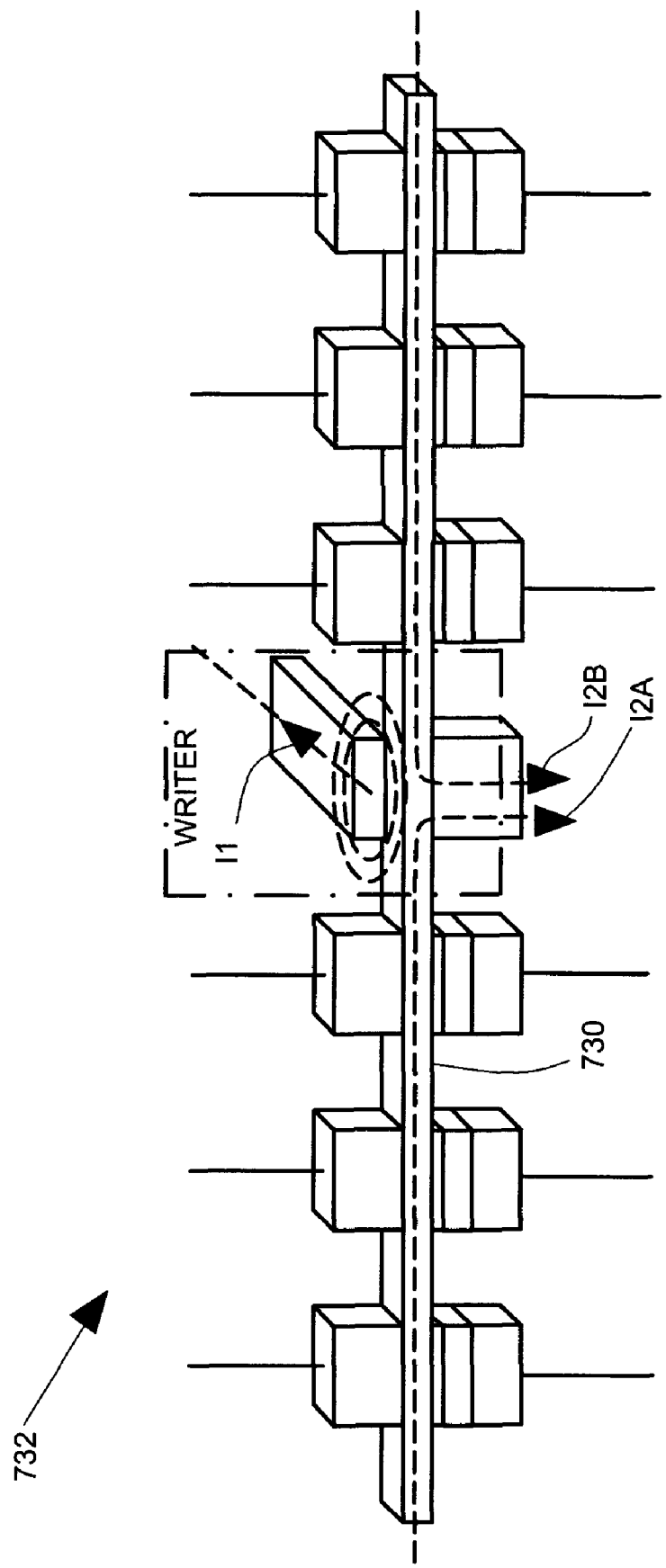
Figure 7C:
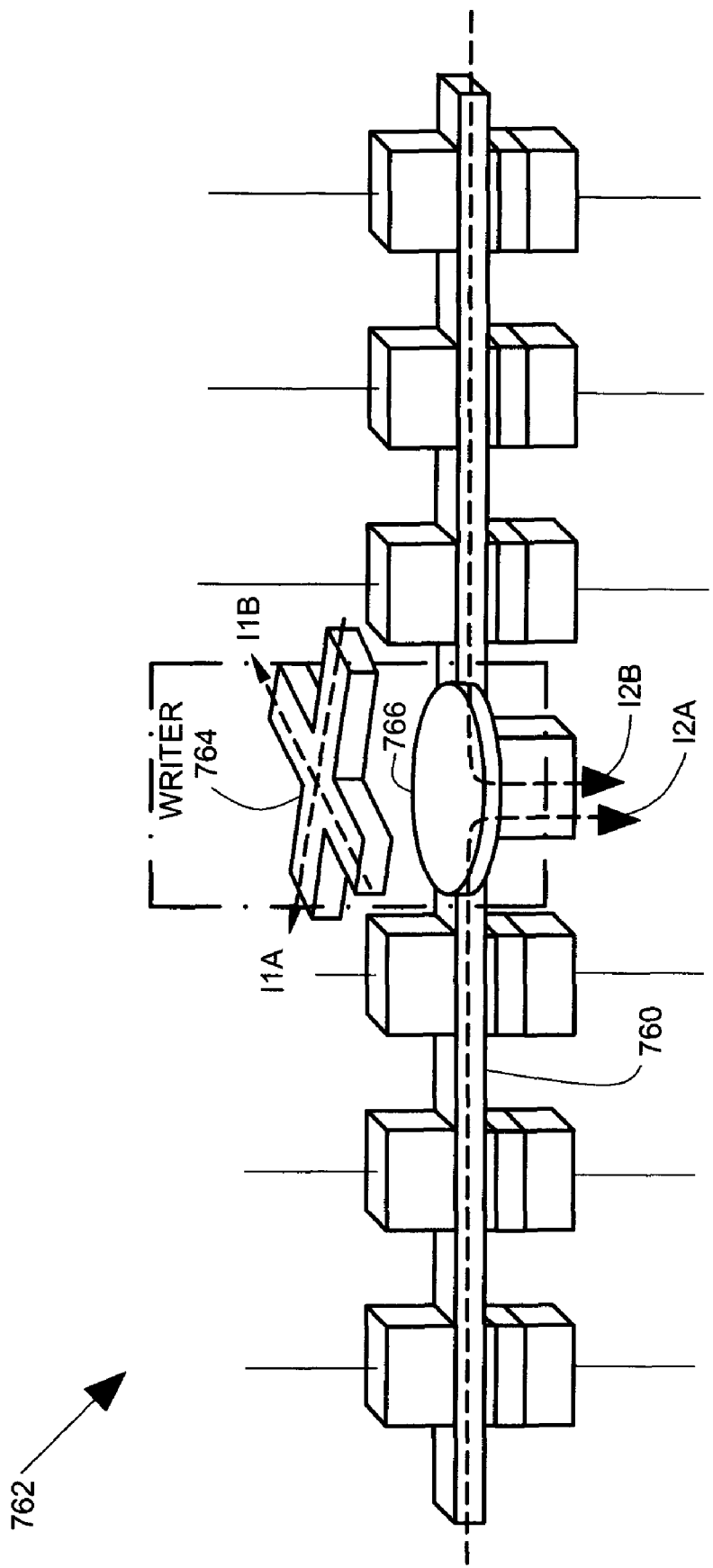

FIGS. 7A, 7B, 7C illustrate cross-sections of arrays of spin-torque based MRAM cells in which a read current path is not aligned with a write current path in a free layer.

FIG. 7A illustrates a cross-section of an array 700 of spin-torque based MRAM cells 702, 704, 706. The cells 702, 704, 706 are similar to the cell 200 illustrated in FIG. 2. Cell 706, for example, includes a top contact layer 708, a free layer 710, a barrier layer 712, a pinned layer 714 and a bottom contact layer 716. The free layer 710 is continuous along a row of MRAM cells, allowing bits of data to be shifted by electron flow along the row during a write operation. It will be understood that insulation layers between cells is not shown, and that row and column read addressing conductors, connecting to top and bottom contact layers, are not shown to improve clarity of the drawing. It will be understood that the row of MRAM cells is much longer than the portion illustrated in FIG. 7A, and that the row continues off the left side of the drawing at 718. A first write current I1 flowing through a write conductor 720 generates a magnetic field 722 that extends into the free layer 710 near a right end of the row. The magnetic field 722 writes bits of data in the free layer 710, in other words, it orients magnetic domains in the free layer 710. A second write current I2 flows along the length of the free layer 710 and moves the domains (bits written) by magnetic field 722 along the length of the free layer 710, shifting bits into the individual MRAM cells. The (conventional) current I2 flows from left to right, and the electron flow associated with current I2 flows from right to left. Bits are shifted in the direction of electron flow.

The sharing of the continuous free layer 710 by a row of MRAM cells allows for increased bit density in the array. An individual bit with areal dimensions F×F, together with its associated insulation, occupies an area of only 4 $F^2$ in the array. F represents a smallest feature size capable of being produced by the wafer process.

FIG. 7B illustrates a cross-section of an array 732 of spin-torque based MRAM cells. The array 732 is similar to the array 700 in FIG. 7A, except that a write current I1 in FIG. 7B is applied near a center of a row of MRAM cells instead of at an end. Bits are shifted into MRAM cells on the left of current I1 by a current I2A through the left portion of the free layer 730. Bits are shifted into MRAM cells on the right of current I1 by a current I2B through a right portion of the free layer 730. In other respects, the array 732 is similar to the array 700. The right or left side of the row of MRAM cells can be addressed by applying either I2B or I2A.

FIG. 7C illustrates a cross-section of an array 762 of spin-torque based MRAM cells. The array 762 is similar to the array 732 in FIG. 7B, except that a first write current comprised two component write currents I1A and I1B. The write currents I1A and I1B flow through conductors at approximately right angles to one another at a conductor crosspoint 764 as illustrated. The conductor crosspoint 764 overlies the free layer 760. According to one aspect, the write currents I1A and I1B are Alternating currents, and the phase of alternating write current I1A is out of phase with the phase of alternating write current I1B. The phase difference between write current I1A and write current I1B results in a rotating magnetic field in a free layer 760. According to one aspect, the phase difference between currents I1A and I1B is 90 electrical degrees. The free layer 760 includes a disc shaped free layer region 766 that receives the rotating magnetic field. A domain in the disc shaped free layer region 766 is rotated by the rotating magnetic field.

FIG. 8 illustrates a cross-section of an array 800 of spin-torque based MRAM cells in which a read current path is not aligned with a write current path in a free layer 802. The array 800 is similar to the array 700 in FIG. 7A, except that a current-perpendicular-to-plane (CPP) cell 812 is used as a writer in array 800 instead of a write conductor as in array 700. In FIG. 8, the CPP cell 812 comprises a top contact layer 804, the free layer 802, a barrier layer 806, a pinned layer 808 and a lower contact layer 810. A first write current I1 writes data (orients domains) in the free layer 802. A second write current I2 shifts the domains along a length of the free layer 802. The free layer 802 passes through a row of MRAM data storage cells. The combination of the CPP cell 812 as a writer for a row in the array and optimization of the write current I1 so that magnetic domains are efficiently oriented via spin torque leads to a compact, low power array of MRAM cells.

Figure 9A:
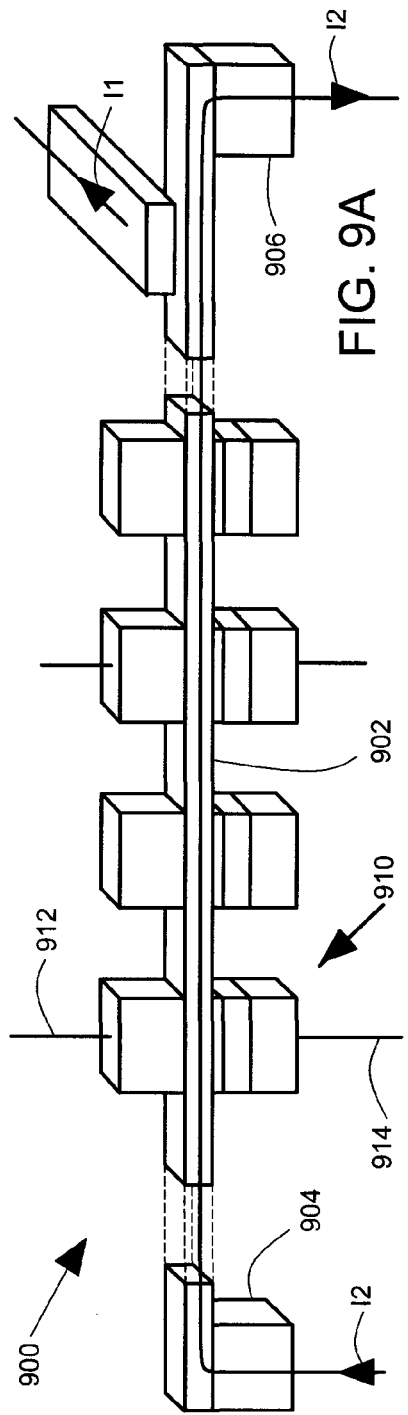
FIGS. 9A, 9B, 9C illustrate cross-sections of arrays of spin-torque based MRAM cells in which read current paths are not aligned with write current paths in free layers.
Figure 9B:
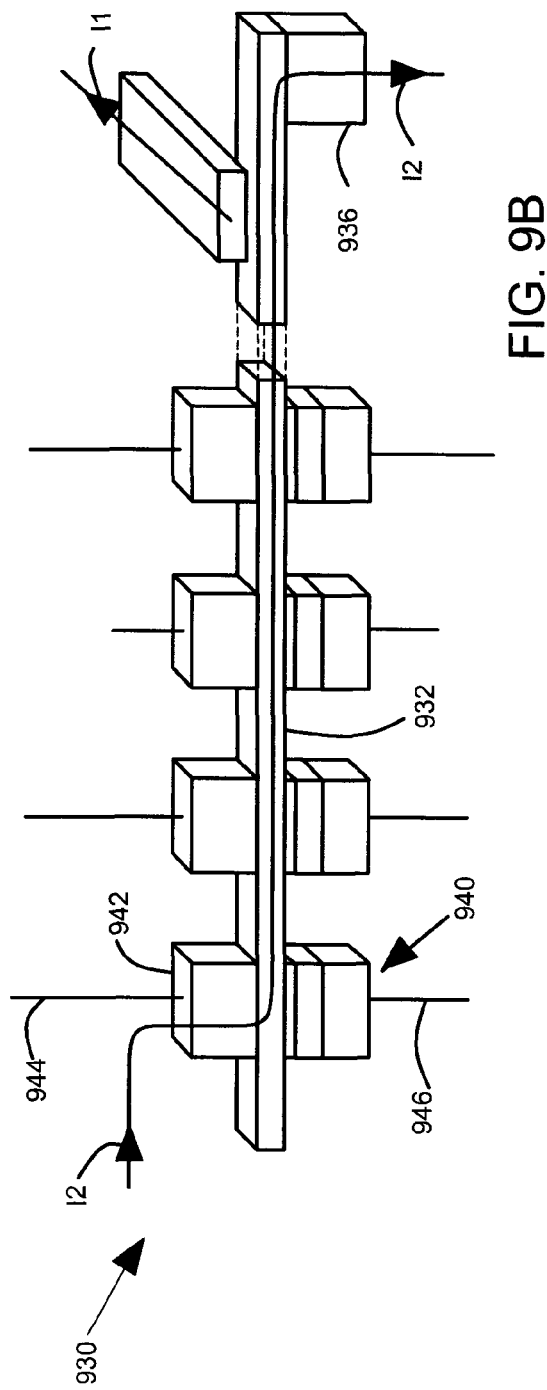
Figure 9C:
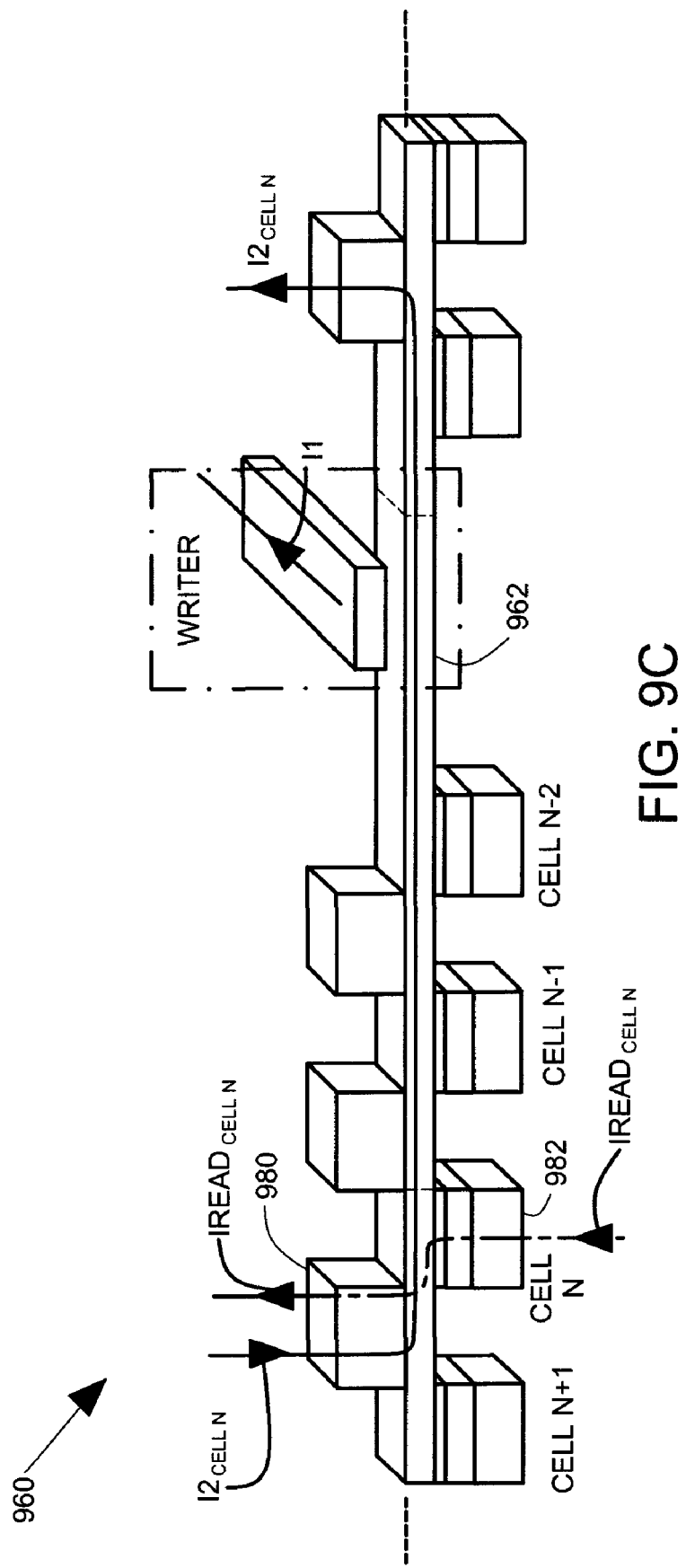

FIGS. 9A, 9B, 9C illustrate cross-sections of arrays of spin-torque based MRAM cells in which a read current path is not aligned with a write current path in a free layer.

FIG. 9A illustrates a row of MRAM cells in an array 900. The array 900 is similar to the array 700 in FIG. 7A. As illustrated in FIG. 9A, a free layer 902 extends from an end contact 904 on a left end of the row to an end contact 906 on a right end of the row. Write current I2 flows from the end contact 904 through free layer 902 to the end contact 906. A read current for exemplary MRAM cell 910 flows through read conductors 912, 914. The circuit paths for read currents and write currents are thus separate from one another, simplifying read and write drive circuitry.

FIG. 9B illustrates a row of MRAM cells in an array 930. The array 930 is similar to the array 900 in FIG. 9A, except that in FIG. 9B, read and write circuits share a common contact 942. As illustrated in FIG. 9B, a free layer 932 extends from the common contact 942 on a left end of the row to an end contact 936 on a right end of the row. Write current I2 flows from the common contact 942 through free layer 932 to the end contact 936. A read current for exemplary MRAM cell 940 flows through read conductors 944, 946. The circuit paths for read currents and write currents share a common contact 942, avoiding the need for a second end contact, however read and write currents flow in different directions in the free layer 932.

FIG. 9C illustrates a row of MRAM cells in an array 960. The MRAM cells include MRAM cells N+1, N, N−1, N−2. The array 960 is similar to the array 930 in FIG. 9B, except that in FIG. 9C, top contacts are offset along a length of a free layer 962 such that top contacts are not aligned with their associated MRAM cells. Top contact N 980 does not overlie MRAM cell N 982, for example. As illustrated in FIG. 9C, the free layer 962 extends the full length of a row, however, write currents for a particular MRAM cell are addressed to a top contact associated with the cell. The write current $I2_{CELL\ N}$, for example, is addressed to top contact N 980 and flows through the free layer in MRAM cell N 982, but does not flow through the free layer in MRAM cell N+1. The write current flows past writer 962 for writing by write current I1. Offsetting the top contact is helpful for the accurate placement of the domain wall in individual MRAM cells.

FIGS. 10A, 10B, 10C, 10D illustrate spin-torque based MRAM cells in which each MRAM cell stores more than one bit of information, and in which a read current path is not aligned with a write current path in a free layer.

Figure 10A:
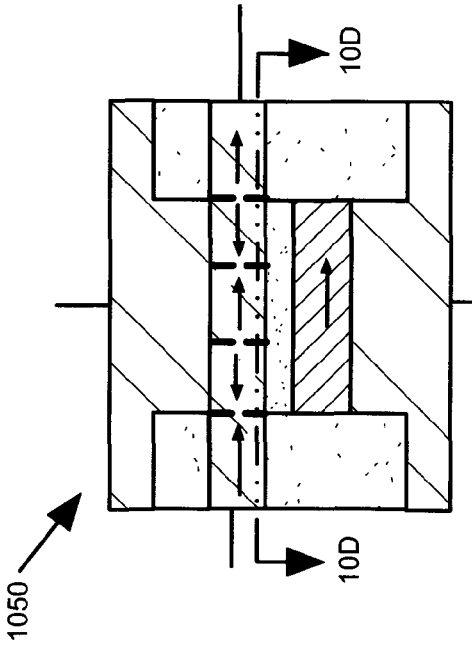
FIGS. 10A, 10B, 10C, 10D illustrate spin-torque based MRAM cells in which each MRAM cell stores more than one bit of information.
Figure 10B:
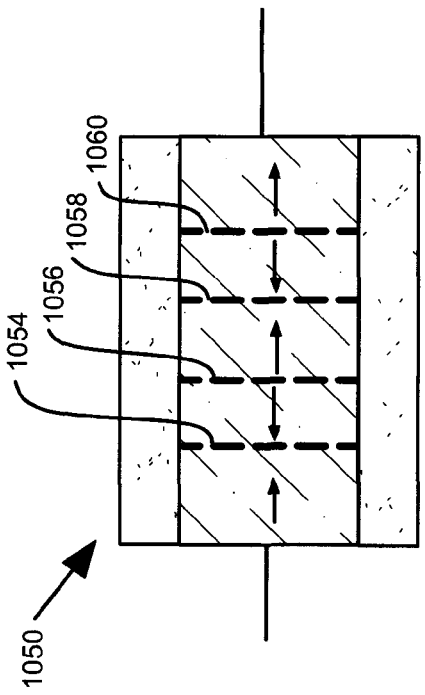

FIG. 10A illustrates a vertical cross section of an MRAM cell 1000. The MRAM cell 1000 includes a free layer 1002 which can store multiple bits of data in multiple domains. MRAM cell 1000 is similar to MRAM cell 200 in FIG. 2 except that MRAM cell 1000 has domains shifted into it such that more than one domain can remain in the free layer after a write operation is complete. FIG. 10B illustrates a cross sectional plan view of MRAM cell 1000, taken along cross-section line 10B-10B in FIG. 10A. As illustrated in FIG. 10B, two domain walls 1004, 1006 are present in the MRAM cell 1000. The MRAM cell 1000 includes a free layer 1002 which can store multiple bits of data in multiple domains.

MRAM cell 1000 is similar to MRAM cell 200 in FIG. 2 except that MRAM cell 1000 has domains shifted into it such that more than one domain can remain in the free layer after a write operation is complete. The multiple domains are created in a writer (such as writer shown in FIGS. 7A, 7B, 7C, 8) and multiple domains are aligned in a single MRAM cell by synchronizing rates of domain wall creation and domain wall motion in the writer. The write currents I1 and I2 are synchronized to align multiple bits in an MRAM cell.

Figure 10C:
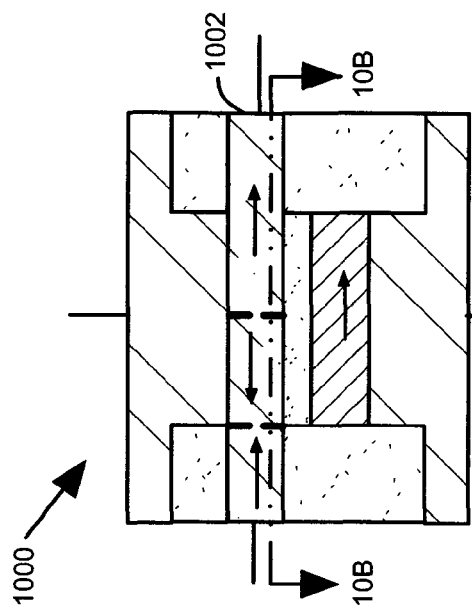
Figure 10D:
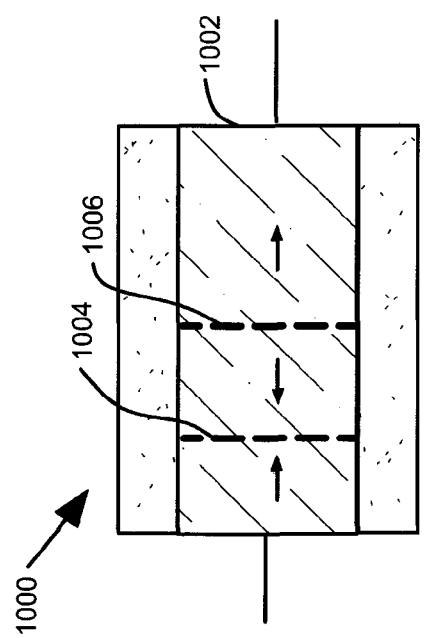

FIG. 10C illustrates a vertical cross section of an MRAM cell 1050. The MRAM cell 1050 includes a free layer 1052 which can store multiple bits of data in multiple domains. MRAM cell 1050 is similar to MRAM cell 1000 in FIGS. 10A, 10B except that MRAM cell 1050 has three domains stored in its free layer 1052. FIG. 10D illustrates a cross sectional plan view of MRAM cell 1000, taken along cross-section line 10D-10D in FIG. 10A. As best illustrated in FIG. 10D, four domain walls 1054, 1056, 1058, 1060 are present in the MRAM cell 1050.

Figure 11:
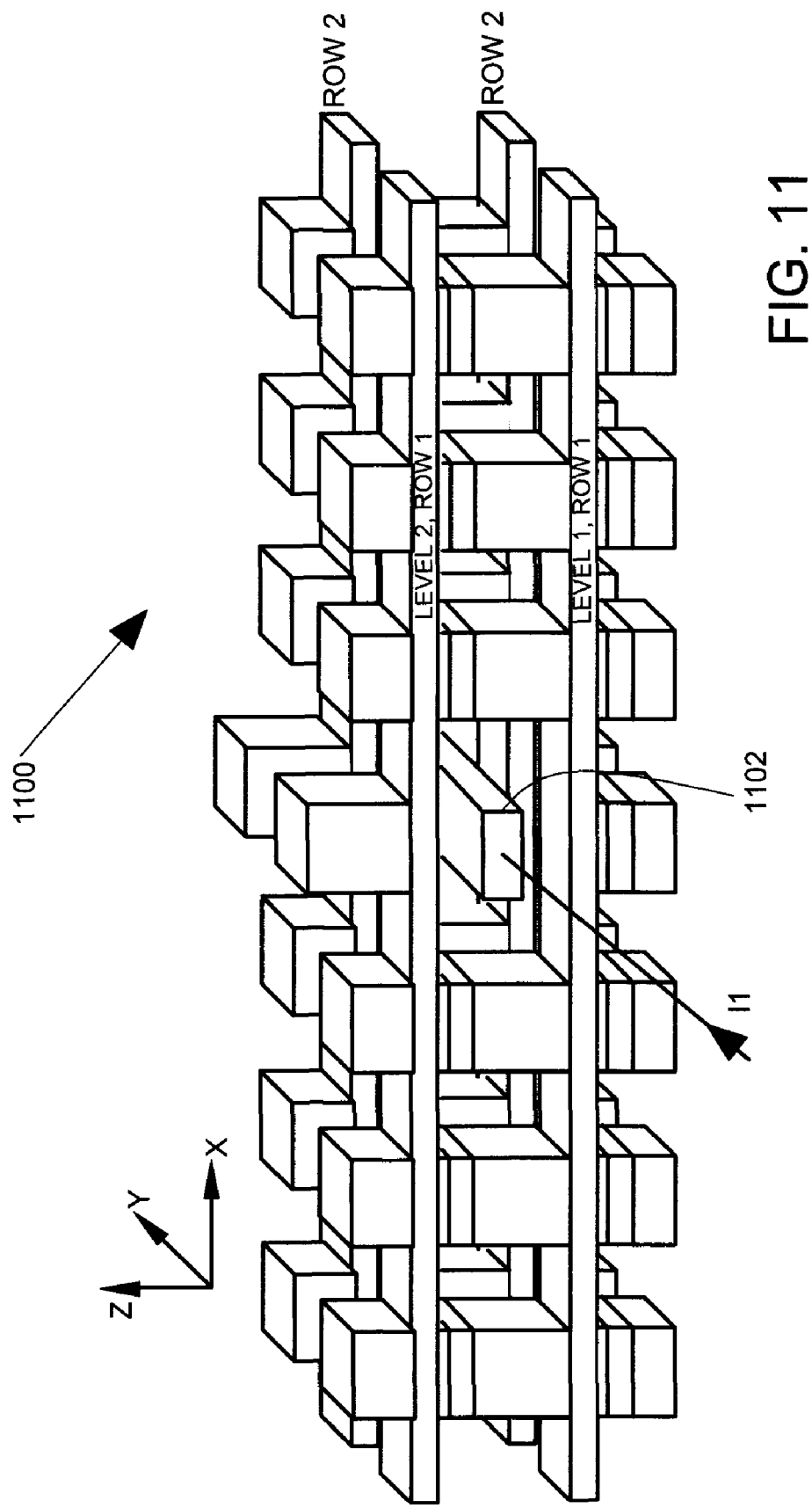
FIG. 11 illustrates a cross-section of an array of spin-torque based MRAM cells in which MRAM cells are stacked in multiple layers.

FIG. 11 illustrates a cross-section of an array 1100 of spin-torque based MRAM cells in which each MRAM cell stores more than one bit of information, and a read current path that is not aligned with a write current path in a free layer. In FIG. 11, MRAM cells are stacked in a Z-axis direction to increase areal density. MRAM cells are also stacked along an X-axis and a Y-axis. The Z-axis is understood to be normal to the major plane of a substrate, and the X and Y axes are each perpendicular to the Z axis and to one another. The array 1100 is a three dimensional array of MRAM cells. Supporting electronics for the MRAM array underlies the MRAM array in an XY plane. As illustrated in FIG. 11, one write conductor 1102 carrying write current I1 can pass over multiple rows and provide a write magnetic field to two stacked levels of MRAM cells.

It is to be understood that even though numerous characteristics and advantages of various aspects have been set forth in the foregoing description, together with details of the structure and function of various aspects of the invention, this disclosure is illustrative only, and changes may be made in detail, especially in matters of structure and arrangement of parts within the principles disclosed to the full extent indicated by the broad general meaning of the terms in which the appended claims are expressed.

What is claimed is:

1. A magnetoresistive memory element, comprising:
   a free layer, and a write current path aligned with a free layer plane;

a pinned layer, the pinned layer and the free layer having magnetization directions aligned with one another;

a barrier layer disposed between the free layer and the pinned layer; and the free, barrier and pinned layers together forming a layer stack having a first read current path that extends through the first layer stack and that is not aligned with the write current path in the free layer; and wherein the free layer comprises discontinuities, and the discontinuities stabilize magnetic domain walls in the free layer.

2. The magnetoresistive memory element of claim 1 wherein a magnetic domain is stored in the free layer, and the magnetic domain is moved by spin torque.

3. The magnetoresistive memory element of claim 1 wherein multiple magnetic domains are stored in the free layer, and the multiple magnetic domains are moved by spin torque.

4. The magnetoresistive memory element of claim 1 wherein an electron flow provided along the free layer plane, and the electron flow moves magnet domains through the free layer.

5. The magnetoresistive memory element of claim 1 wherein data are stored in the free layer, and the direction of the first read current path in the free layer is such that a read current along the first read current path cannot accidentally write data in the free layer.

6. The magnetoresistive memory element of claim 1 wherein the magnetization direction of the pinned layer is parallel to plane.

7. The magnetoresistive memory element of claim 1 wherein the magnetization direction of the pinned layer is perpendicular to plane.

8. The magnetoresistive memory element of claim 1 wherein the free layer comprises an alignment layer that has a temperature sensitive magnetic property.

9. The magnetoresistive memory element of claim 8 wherein the alignment layer comprises FeRh.

10. The magnetoresistive memory element of claim 8 wherein the alignment layer comprises an antiferromagnetic metal selected from the group of Mn alloys: IrMn, PtMn and NiMn.

11. A magnetoresistive memory element, comprising:
a free layer, and a write current path aligned with a free layer plane;
a pinned layer, the pinned layer and the free layer having magnetization directions aligned with one another;
a barrier layer disposed between the free layer and the pinned layer; and the free, barrier and pinned layers together forming a layer stack having a first read current path that extends through the first layer stack and that is not aligned with the write current path in the free layer;
a second layer stack having an internal construction the same as the first layer stack and sharing a common free layer that is common to the first and second free layer stacks;
a writer coupled to the common free layer and providing a series of domains formed by spin torque to the common free layer; and
a read circuit providing a first read current to the first read current path and providing a second read current to a second read current path in the second layer stack.

12. The magnetoresistive memory element of claim 11, wherein the writer provides a magnetic field that produces a series of domains in the common free layer, and the writer provides a write current that moves the series of domains along the common free layer to first and second magnetoresistive memory elements in the first and second layer stacks.

13. The magnetoresistive memory element of claim 12 wherein the writer provides a rotating magnetic field and the free layer comprises a disc shaped free layer region that receives the rotating magnetic field.

14. The magnetoresistive memory element of claim 11 wherein the writer comprises a current-perpendicular-to-plane writer.

15. The magnetoresistive memory element of claim 11 further comprising third and fourth layer stacks, and the first, second, third and fourth layer stacks are arrayed along X and Y axes.

16. The magnetoresistive memory element of claim 15 wherein the array includes additional layer stacks that are stacked along a z axis with the arrayed first, second, third and fourth layer stacks.

* * * * *